(12) United States Patent
Bathan et al.

(10) Patent No.: US 7,545,032 B2
(45) Date of Patent: Jun. 9, 2009

(54) INTEGRATED CIRCUIT PACKAGE SYSTEM WITH STIFFENER

(75) Inventors: Henry D. Bathan, Singapore (SG); Antonio B. Dimaano, Jr., Singapore (SG); Jeffrey D. Punzalan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 225 days.

(21) Appl. No.: 11/456,544

(22) Filed: Jul. 10, 2006

(65) Prior Publication Data

US 2008/0006926 A1    Jan. 10, 2008

(51) Int. Cl.
*H01L 23/48* (2006.01)
(52) U.S. Cl. .................. 257/690; 257/706; 257/713; 438/122
(58) Field of Classification Search .......... 438/122; 257/690, 706, 707, 713
See application file for complete search history.

(56) References Cited

U.S. PATENT DOCUMENTS

| 6,951,776 | B2 | 10/2005 | Lo et al. | |
|---|---|---|---|---|
| 7,025,848 | B2 | 4/2006 | Wang | |
| 7,045,890 | B2 | 5/2006 | Xie et al. | |
| 7,051,311 | B2 | 5/2006 | Tomita et al. | |
| 2004/0125568 | A1 | 7/2004 | Tao | |
| 2007/0045824 | A1* | 3/2007 | Zhao et al. | 257/706 |
| 2007/0108598 | A1* | 5/2007 | Zhong et al. | 257/707 |
| 2007/0170554 | A1* | 7/2007 | Camacho et al. | 257/666 |
| 2007/0241431 | A1* | 10/2007 | Manatad | 257/673 |
| 2008/0001263 | A1* | 1/2008 | Dimaano et al. | 257/666 |

* cited by examiner

*Primary Examiner*—Fernando L Toledo
(74) *Attorney, Agent, or Firm*—Mikio Ishimaru

(57) ABSTRACT

An integrated circuit package system is provided including forming a mounting structure having an external interconnect, a paddle, and a tie bar; mounting an integrated circuit die on the paddle; soldering a stiffener structure; having an opening; on the mounting structure; connecting the stiffener structure to a ground; and molding the integrated circuit die and partially the stiffener structure through the opening.

20 Claims, 3 Drawing Sheets

INTEGRATED CIRCUIT PACKAGE SYSTEM WITH STIFFENER

TECHNICAL FIELD

The present invention relates generally to integrated circuit packages and more particularly to integrated circuit packages with a heat sink.

BACKGROUND ART

Every new generation of integrated circuits with increased operating frequency, performance and the higher level of large scale integration have underscored the need for back-end semiconductor manufacturing to increase the heat management capability within an encapsulated package. It is well acknowledged that when a semiconductor device becomes denser in term of electrical power consumption per unit volume, heat generated is also increases correspondingly. More and more packages are now designed with an external heat sink or heat slug to enhance the ability of heat being dissipated to the package ambient environment. As the state of the art progresses, the ability to adequately dissipate heat is often a constraint on the rising complexity of package architecture design, smaller footprint, higher device operating speed and power consumption.

Modern electronics, such as smart phones, personal digital assistants, location based services devices, enterprise class servers, or enterprise class storage arrays, are packing more integrated circuits into an ever shrinking physical space with expectations for decreasing cost. Contemporary electronics expose integrated circuits and packages to more demanding and sometimes new environmental conditions, such as cold, heat, and humidity requiring integrated circuit packages to provide robust thermal management structures.

As more functions are packed into the integrated circuits and more integrated circuits into the package, more heat is generated degrading the performance, the reliability, and the lifetime of the integrated circuits. As more circuitry is packed into the integrated circuits, the integrated circuit generates more radiated energy called electromagnetic interference (EMI). Unlike heat, EMI should not be dissipated to the environment but its energy should be absorbed by the system back to a ground plane. Another consequence of continued integration, the number of input/output (I/O) may increase to cause increases to the width and length of the integrated circuit package. These increased dimensions make the large integrated circuit package prone to warpage to cause manufacturing, yield, reliability, and functional problems.

Numerous technologies have been developed to meet these requirements. Some of the research and development strategies focus on new package technologies while others focus on improving the existing package technologies. Research and development in the existing package technologies may take a myriad of different directions.

One proven way to reduce cost is to use mature package technologies with existing manufacturing methods and equipments. Paradoxically, the reuse of existing manufacturing processes does not typically result in the reduction of package dimensions. Existing packaging technologies struggle to cost effectively meet the ever demanding thermal, EMI, and structural requirements of today's integrated circuits and packages.

Most integrated circuit devices use molded plastic epoxy as an epoxy mold compound (EMC) for protecting package. But the poor heat dissipation property of EMC sometimes leads to device malfunctions. Some approaches use external heat spreaders but do not help with EMI or warpage problems. Other approaches use internal heat sinks or spreaders but do not mitigate both EMI and warpage problems.

Thus, a need still remains for an integrated circuit package system providing low cost manufacturing, improved reliability, increased thermal performance, EMI mitigation, and robust structural support for large integrated circuit package. In view of the ever-increasing need to save costs and improve efficiencies, it is more and more critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including forming a mounting structure having an external interconnect, a paddle, and a tie bar; mounting an integrated circuit die on the paddle; soldering a stiffener structure; having an opening; on the mounting structure; connecting the stiffener structure to a ground; and molding the integrated circuit die and partially the stiffener structure through the opening.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
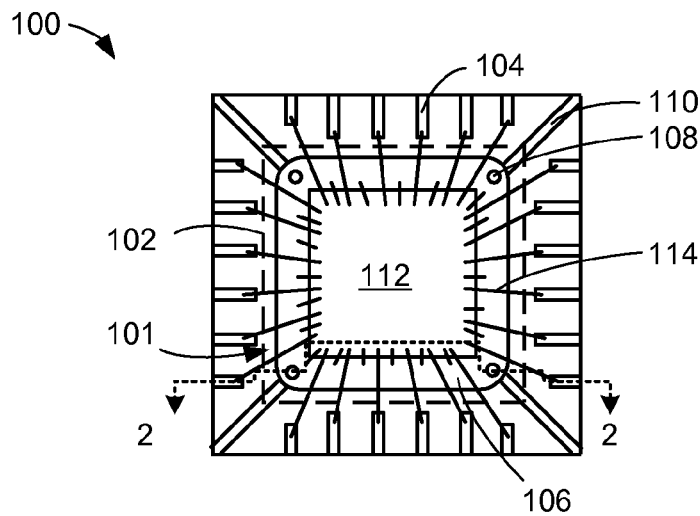
FIG. 1 is a plan view of an integrated circuit package system in an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the apparatus are semi-diagrammatic and not to scale and, particularly, some of the dimensions are for the clarity of presentation and are shown greatly exaggerated in the figures. In addition, where multiple embodiments are disclosed and described having some features in common, for clarity and ease of illustration, description, and comprehension thereof, similar and like features one to another will ordinarily be described with like reference numerals.

The term "horizontal" as used herein is defined as a plane parallel to the conventional integrated circuit surface, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "processing" as used herein includes deposition of material, patterning, exposure, development, etching, cleaning, molding, and/or removal of the material or as required in forming a described structure.

Referring now to FIG. 1, therein is shown a plan view of an integrated circuit package system 100 in an embodiment of the present invention. The integrated circuit package system 100, such as a quad leadless package (QLP), provides a mounting structure 101 for a stiffener structure 102. The stiffener structure 102 extends towards external interconnects 104, such as leads, and beyond a paddle 106, such as a die-attach paddle.

The stiffener structure 102, such as a rigid thermally and electrically conductive structure or heat sink, attaches to the paddle 106, also serving as the mounting structure 101, with supports 108, such as bump posts. The paddle 106 attaches to tie bars 110 at the corners of the paddle 106. An integrated circuit die 112 mounts on the paddle 106 and within the space on the paddle 106 for the supports 108. Interconnects 114, such as bond wires or ribbon bond wires, connect the integrated circuit die 112 and the external interconnects 104. The integrated circuit package system 100 may connect to the next system level (not shown), such as a printed circuit board.

The operation of the integrated circuit die 112 generates electromagnetic interference (EMI). The stiffener structure 102 serves as an electromagnetic interference (EMI) shield with the stiffener structure 102, the supports 108, and the paddle 106 connected to a ground of the next system level.

The operation of the integrated circuit die 112 also generates heat. The stiffener structure 102 dissipates thermal energy or heat away from the integrated circuit die 112. There is a number of thermal dissipation paths from the integrated circuit die 112. Heat may flow from the integrated circuit die 112 to the paddle 106 then through the supports 108 and dissipating to the stiffener structure 102 that is exposed to ambient. Thermal conduction may also flow from the integrated circuit die 112 to the stiffener structure 102 without traveling through the paddle 106. Thermal conduction may also flow from the integrated circuit die 112 through the paddle 106 to the next system level, wherein the paddle 106 is connected to a system level heat sink (not shown) on the next system level.

Increased circuitry content in the integrated circuit package system 100 typically requires a large number of the external interconnects 104 for the integrated circuit die 112 to communicate with the next system level. This large number of the external interconnects 104 increases the width and length of the integrated circuit package system 100. The larger width and length dimensions make the integrated circuit package system 100 prone to warpage resulting in poor reliability, low yield, and increased cost. As an example, the integrated circuit package system 100, such as a quad leadless package, with the width and length around 12 mm by 12 mm or greater is susceptible to warpage. Smaller packages may also be susceptible to warpage based on the structure of the package. The stiffener structure 102 along with the paddle 106 and the supports 108 provide planar rigidity mitigating warpage.

Figure 2:
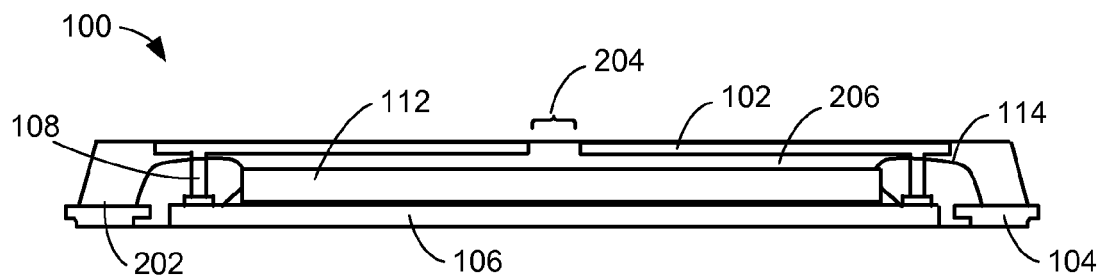
FIG. 2 is a cross-sectional view of the integrated circuit package system along the segment line 2-2 of FIG. 1.

Referring now to FIG. 2, therein is shown a cross-sectional view of the integrated circuit package system along the segment line 2-2 of FIG. 1. The integrated circuit die 112 is attached to the paddle 106 with an adhesive 202, such as a die-attach adhesive. The interconnects 114 connect between the integrated circuit die 112 and the external interconnects 104.

The stiffener structure 102 has an opening 204 for top package mold gate to form an encapsulation 206. The encapsulation 206, such as an epoxy mold compound (EMC), covers the integrated circuit die 112 and the interconnects 114. The stiffener structure 102 is partially covered by the encapsulation 206 with the supports 108 of the stiffener structure 102 covered and the top surface of the stiffener structure 102 exposed to ambient for heat dissipation. The supports 108 serve as mold lock features such that the encapsulation 206 also contributes to the planar rigidity of the integrated circuit package system 100.

The stiffener structure 102 over the integrated circuit die 112, the paddle 106, and the external interconnects 104. The stiffener structure 102 may be attached to the paddle 106 by any number of processes. The stiffener structure 102, the supports 108 and the paddle 106 provide thermal dissipation paths, EMI shielding, and planar rigidity to mitigate warpage of the integrated circuit package system 100. The stiffener structure 102 and the supports 108 may be attached to the paddle 106 with a surface mount technology (SMT) to provide a robust mechanical attachment needed to mitigate warpage. The stiffener structure 102 is electrically connected to ground to provide EMI shielding. For illustrative purposes, the supports 108 are shown as integral to the stiffener structure 102, although it is understood that the supports 108 may not be part of the stiffener structure 102.

The integrated circuit package system 100 provides a number of thermal dissipation paths. For example, the heat may flow from the integrated circuit die 112 through the encapsulation 206 to the stiffener structure 102. The heat from the stiffener structure 102 dissipates from the top surface of the stiffener structure 102 to ambient improving the thermal performance of the integrated circuit package system 100. For illustrative purpose, the integrated circuit die 112 is shown by itself, although it is understood that other devices and device configurations may also be used in this invention.

Figure 3:
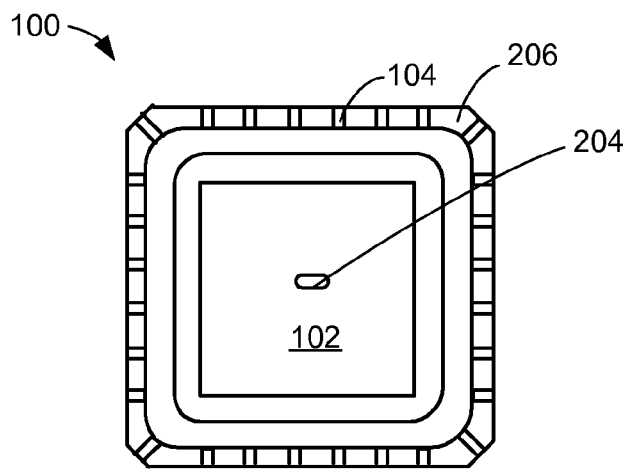
FIG. 3 is a top view of the integrated circuit package system of FIG. 2.

Referring now to FIG. 3, therein is shown a top view of the integrated circuit package system 100 of FIG. 2. The stiffener structure 102 having the opening 204 is exposed to ambient. The encapsulation 206 surrounds the stiffener structure 102 and fills the opening 204. The external interconnects 104 are exposed for top side connection to the integrated circuit package system 100. For illustrative purposes, the integrated circuit package system 100 is shown as a punched QLP, although it is understood that the integrated circuit package system 100 may be other package types, such as a sawn QLP.

Figure 4:
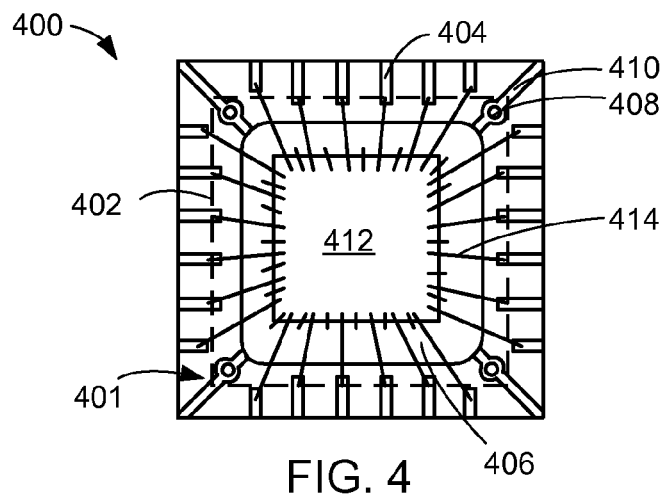
FIG. 4 is a plan view of an integrated circuit package system in an alternative embodiment of the present invention.

Referring now to FIG. 4, therein is shown a plan view of an integrated circuit package system 400 in an alternative embodiment of the present invention. The integrated circuit package system 400, such as a quad leadless package (QLP), provides a mounting structure 401 for a stiffener structure 402. The stiffener structure 402 extends to external interconnects 404, such as leads, and beyond a paddle 406, such as a die-attach paddle.

The stiffener structure 402, such as a rigid thermally and electrically conductive structure or heat sink, attaches to tie bars 410, also serving as the mounting structure 401, with supports 408, such as bump posts. The paddle 406 attaches to the tie bars 410 at the corners of the paddle 406. An integrated circuit die 412 mounts on the paddle 406. Interconnects 414, such as bond wires, connect the integrated circuit die 412 and the external interconnects 404. The integrated circuit package system 400 may connect to the next system level (not shown), such as a printed circuit board.

The stiffener structure 402 serves as an electromagnetic interference (EMI) shield with the stiffener structure 402, the supports 408, the tie bars 410, and the paddle 406 connected to a ground, such as a ground of the next system level. The stiffener structure 402 dissipates heat away from the integrated circuit die 412. Heat may flow from the integrated circuit die 412 to the paddle 406 then to the tie bars 410 through the supports 408 and dissipating to the stiffener structure 402 that is exposed to ambient. Thermal conduction may also flow from the integrated circuit die 412 to the stiffener structure 402 without traveling through the paddle 406. Thermal conduction may also flow from the integrated circuit die 412 through the paddle 406 to the next system level, wherein the paddle 406 is connected to a system level heat sink (not shown) on the next system level.

A large number of the external interconnects 404 increases the width and length of the integrated circuit package system 400. The larger width and length dimensions make the integrated circuit package system 400 prone to warpage resulting in poor reliability, low yield, and increased cost. The stiffener structure 402 along with the tie bars 410 and the supports 408 provide planar rigidity mitigating warpage.

The stiffener structure 402, the supports 408 the tie bars 410, and the paddle 406 provide thermal dissipation paths, EMI shielding, and planar rigidity to mitigate warpage of the integrated circuit package system 400. The stiffener structure 402 and the supports 408 may be attached to the tie bars 410 with a surface mount technology (SMT) to provide a robust mechanical attachment needed to mitigate warpage.

Figure 5:
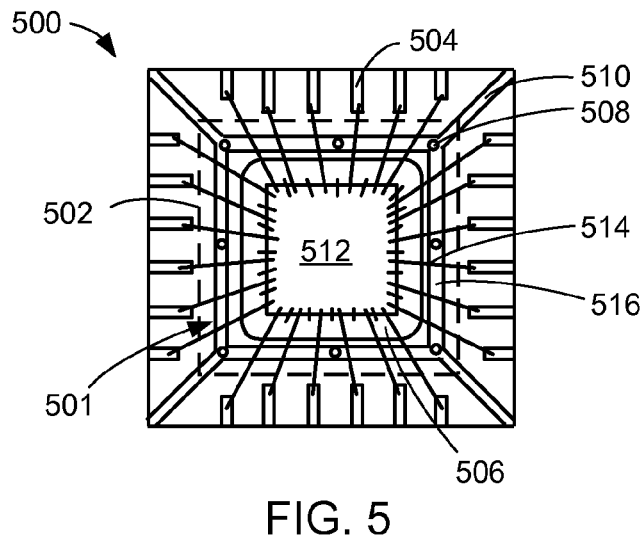
FIG. 5 is a plan view of an integrated circuit package system in another alternative embodiment of the present invention.

Referring now to FIG. 5, therein is shown a plan view of an integrated circuit package system 500 in another alternative embodiment of the present invention. The integrated circuit package system 500, such as a quad leadless package (QLP), provides a mounting structure 501 for a stiffener structure 502. The stiffener structure 502 extends to external interconnects 504, such as leads, and beyond a paddle 506, such as a die-attach paddle.

The stiffener structure 502, such as a rigid thermally and electrically conductive structure or heat sink, attaches to a ring 516, such as a ground ring, with supports 508, such as bump posts. The ring 516 serves as the mounting structure 501. The ring 516 is shown in a square geometric configuration with the corners of the ring 516 attached to tie bars 510. The ring 516 surrounds the paddle 506. An integrated circuit die 512 mounts on the paddle 506. Interconnects 514, such as bond wires, connect the integrated circuit die 512 and the external interconnects 504. The integrated circuit package system 500 may connect to the next system level (not shown), such as a printed circuit board.

The stiffener structure 502 serves as an electromagnetic interference (EMI) shield with the stiffener structure 502, the supports 508, the tie bars 510, and the ring 516 connected to a ground, such as a ground of the next system level. The stiffener structure 502 dissipates heat away from the integrated circuit die 512. Heat may flow from the integrated circuit die 512 to the paddle 506 then to the tie bars 510 through the supports 508 and dissipating to the stiffener structure 502 that is exposed to ambient. Thermal conduction may also flow from the integrated circuit die 512 to the stiffener structure 502 without traveling through the paddle 506. Thermal conduction may also flow from the integrated circuit die 512 through the paddle 506 to the next system level, wherein the paddle 506 is connected to a system level heat sink (not shown) on the next system level.

A large number of the external interconnects 504 increases the width and length of the integrated circuit package system 500. The larger width and length dimensions make the integrated circuit package system 500 prone to warpage resulting in poor reliability, low yield, and increased cost. The stiffener structure 502 along with the supports 508, the tie bars 510, and the ring 516 provide planar rigidity mitigating warpage. The stiffener structure 502 and the supports 508 may be attached to the ring 516 with a surface mount technology (SMT) to provide a robust mechanical attachment needed to mitigate warpage.

Figure 6:
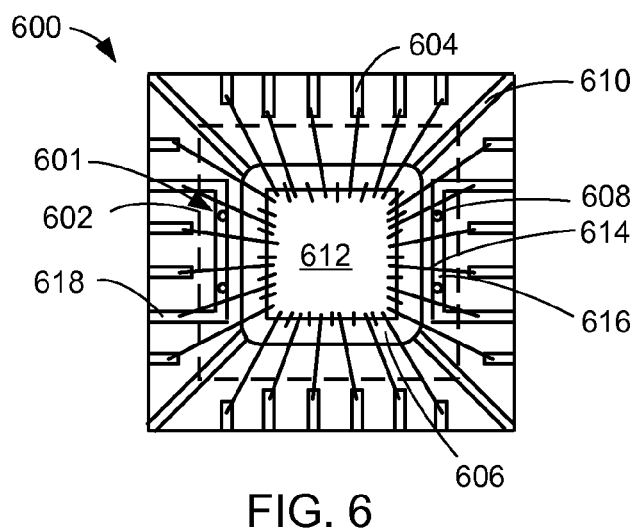
FIG. 6 is a plan view of an integrated circuit package system in yet another alternative embodiment of the present invention.

Referring now to FIG. 6, therein is shown a plan view of an integrated circuit package system 600 in yet another alternative embodiment of the present invention. The integrated circuit package system 600, such as a quad leadless package (QLP), provides a mounting structure 601 for a stiffener structure 602. The stiffener structure 602 extends to external interconnects 604, such as leads, and beyond a paddle 606, such as a die-attach paddle.

The stiffener structure 602, such as a rigid thermally and electrically conductive structure or heat sink, attaches to segments 616, also serving as the mounting structure 601, with supports 608, such as bump posts. The segments 616 attach to extensions 618. The extensions 618 are a selected number of the external interconnects 604 extending further into the interior region of the integrated circuit package system 600 preventing the segments 616 from contacting the external interconnects 604 that are not extended. The extensions 618 may be connected to ground. An integrated circuit die 612 mounts on the paddle 606. Interconnects 614, such as bond wires, connect the integrated circuit die 612 and the external interconnects 604. The integrated circuit package system 600 may connect to the next system level (not shown), such as a printed circuit board.

The stiffener structure 602 serves as an electromagnetic interference (EMI) shield with the stiffener structure 602, the supports 608, the segments 616, and the extensions 618 connected to a ground, such as a ground of the next system level. The stiffener structure 602 dissipates heat away from the integrated circuit die 612. Heat may flow from the integrated circuit die 612 dissipating to the stiffener structure 602 that is exposed to ambient. Thermal conduction may also flow from the integrated circuit die 612 through the paddle 606 to the next system level, wherein the paddle 606 is connected to a system level heat sink (not shown) on the next system level.

A large number of the external interconnects 604 increases the width and length of the integrated circuit package system 600. The larger width and length dimensions make the integrated circuit package system 600 prone to warpage resulting in poor reliability, low yield, and increased cost. The stiffener structure 602 along with the supports 608, the segments 616, and the extensions 618 provide planar rigidity mitigating warpage. The stiffener structure 602 and the supports 608 may be attached to the segments 616 with a surface mount technology (SMT) to provide a robust mechanical attachment needed to mitigate warpage.

Figure 7:
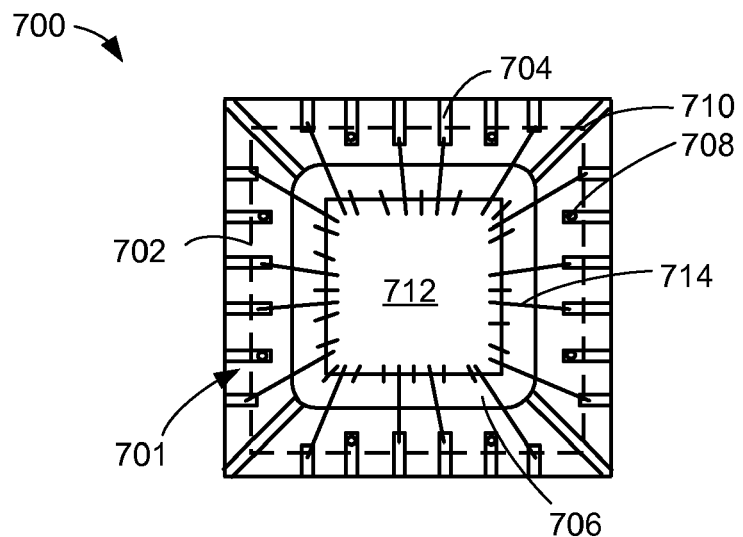
FIG. 7 is a plan view of an integrated circuit package system in yet another alternative embodiment of the present invention.

Referring now to FIG. 7, therein is shown a plan view of an integrated circuit package system 700 in yet another alternative embodiment of the present invention. The integrated circuit package system 700, such as a quad leadless package (QLP), provides a mounting structure 701 for a stiffener structure 702. The stiffener structure 702 extends to external interconnects 704, such as leads, and beyond a paddle 706, such as a die-attach paddle.

The stiffener structure 702, such as a rigid thermally and electrically conductive structure or heat sink, attaches to a selected number of the external interconnects 704, also serving as the mounting structure 701, with supports 708, such as bump posts. An integrated circuit die 712 mounts on the paddle 706. Interconnects 714, such as bond wires, connect the integrated circuit die 712 and the external interconnects 704. The integrated circuit package system 700 may connect to the next system level (not shown), such as a printed circuit board.

The stiffener structure 702 serves as an electromagnetic interference (EMI) shield with the stiffener structure 702 and the supports 708 connected to a ground, such as a ground of the next system level. The stiffener structure 702 dissipates heat away from the integrated circuit die 712. Heat may flow from the integrated circuit die 712 dissipating to the stiffener structure 702 that is exposed to ambient. Thermal conduction may also flow from the integrated circuit die 712 through the paddle 706 to the next system level, wherein the paddle 706 is connected to a system level heat sink (not shown) on the next system level.

A large number of the external interconnects 704 increases the width and length of the integrated circuit package system 700. The larger width and length dimensions make the integrated circuit package system 700 prone to warpage resulting in poor reliability, low yield, and increased cost. The stiffener structure 702 along with the supports 708 and the external interconnects 704 provide planar rigidity mitigating warpage. The stiffener structure 702 and the supports 708 may be attached to the external interconnects 704 with a surface mount technology (SMT) to provide a robust mechanical attachment needed to mitigate warpage.

Figure 8:
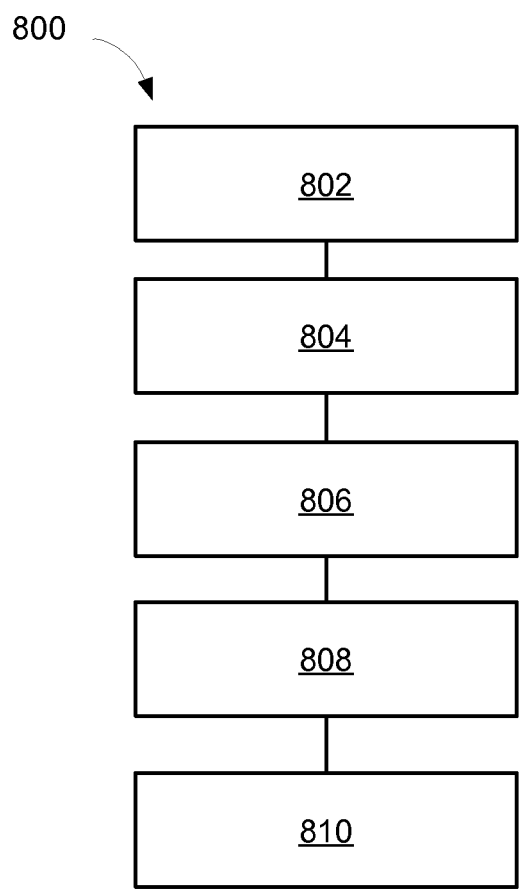
FIG. 8 is a flow chart of an integrated circuit package system for manufacture of the integrated circuit package system in an embodiment of the present invention.

Referring now to FIG. 8, therein is shown a flow chart of an integrated circuit package system 800 for manufacture of the integrated circuit package system 100 in an embodiment of the present invention. The system 800 includes forming a mounting structure having an external interconnect; a paddle, and a tie bar in a block 802; mounting an integrated circuit die on the paddle in a block 804; soldering a stiffener structure, having an opening, on the mounting structure in a block 806; connecting the stiffener structure to a ground in a block 808; and molding the integrated circuit die and partially the stiffener structure through the opening in a block 810.

It has been discovered that the present invention thus has numerous aspects.

It has been discovered that the present invention provides a stiffener for a large integrated circuit package system that serves as an EMI shield, a heat sink, a package warpage mitigation structure, or a combination thereof. The stiffener electrical connection to ground allows EMI to be absorbed as opposed to be radiated. The electrical conductive material of the stiffener is also thermally conductive allowing the stiffener to function also as a heat sink. The SMT attachment and the stiffener provide planar rigidity to mitigate warpage. The stiffener also has an opening at the top surface also for top center gate molding to mitigate wire sweeps of the bond wires.

An aspect is that the present invention provides the stiffener structure with an opening enabling the use of a top center gate mold. The top center gate mold opening is used to form the encapsulation while decreasing risk of wire sweeps and degating.

Another aspect of the present invention provides the top center gate mold enabled by the heat slug having the opening easing design requirements and allowing use of lower cost processes. For example, longer bond wires may be attached with lower cost bonding processes and equipments.

Yet another aspect of the present invention provides the top center gate mold enabled by the heat slug having the opening allowing use of high K epoxy mold compound that was not previously used due to wire sweep problems.

Yet another aspect of the present invention provides mold lock feature from the supports between the stiffener and the mounting structure.

Yet another aspect of the present invention is the use of surface mount technology to create robust mechanical connection between the stiffener, the supports, and the mounting structure. The robust mechanical connection will withstand force that may cause package warpage and improving solder joint reliability (SJR).

Yet another aspect of the present invention is the ability to connect the stiffener to ground. This allows the stiffener to function as an EMI shield.

Thus, it has been discovered that the integrated circuit package system method of the present invention furnishes important and heretofore unknown and unavailable solutions, capabilities, and functional aspects for improving thermal performance, reducing EMI, and reliability in systems. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit package system comprising:
    forming a mounting structure having an external interconnect, a paddle, and a tie bar;
    mounting an integrated circuit die on the paddle;
    soldering a stiffener structure, having an opening, on the mounting structure;
    connecting the stiffener structure to a ground; and
    molding the integrated circuit die and partially the stiffener structure through the opening.

2. The system as claimed in claim 1 wherein soldering the stiffener structure, having the opening, on the mounting structure includes soldering the stiffener structure and the paddle.

3. The system as claimed in claim 1 wherein soldering the stiffener structure includes forming the stiffener structure with a material having planar rigidity.

4. The system as claimed in claim 1 wherein soldering the stiffener structure includes:
    forming the stiffener structure with a support; and
    soldering the support on the mounting structure.

5. The system as claimed in claim 1 wherein forming the mounting structure having the external interconnect, the paddle, and the tie bar includes forming the external interconnect, the paddle, and the tie bar with a material having planar rigidity.

6. An integrated circuit package system comprising:
    forming a solder mount surface having an external interconnect, a paddle, and a tie bar;
    mounting an integrated circuit die on the paddle with an adhesive;
    soldering a conductive stiffener, having an opening, on the solder mount surface;

connecting the solder mount surface and the conductive stiffener to a ground; and top center gate molding the integrated circuit die and the conductive stiffener through the opening.

7. The system as claimed in claim 6 wherein top center gate molding the integrated circuit die and the conductive stiffener through the opening includes partially exposing the conductive stiffener to ambient.

8. The system as claimed in claim 6 further comprising:
forming a ring, connected to the tie bar, as part of the mounting structure; and wherein soldering the conductive stiffener includes:
soldering the conductive stiffener and the ring.

9. The system as claimed in claim 6 further comprising:
forming a segment, connected to the external interconnect, as part of the mounting structure; and
wherein soldering the stiffener structure includes:
soldering the stiffener structure and the segment.

10. The system as claimed in claim 6 wherein soldering the conductive stiffener includes soldering the conductive stiffener and the tie bar.

11. An integrated circuit package system comprising:
a mounting structure having an external interconnect, a paddle, and a tie bar;
an integrated circuit die on the paddle;
a stiffener structure, having an opening, on the mounting structure with solder;
the stiffener structure connected to a ground; and
an encapsulation to cover the integrated circuit die and partially cover the stiffener structure with the encapsulation in the opening.

12. The system as claimed in claim 11 wherein the stiffener structure, having the opening, on the mounting structure is on the paddle.

13. The system as claimed in claim 11 wherein the stiffener structure has a material having planar rigidity.

14. The system as claimed in claim 11 wherein the stiffener structure, having the opening, on the mounting structure with solder includes:

the stiffener structure with a support; and
the support on the mounting structure with solder.

15. The system as claimed in claim 11 wherein the mounting structure having the external interconnect, the paddle, and the tie bar includes the external interconnect, the paddle, and the tie bar having a material with planar rigidity.

16. The system as claimed in claim 11 wherein:
the mounting structure is a solder mount surface having the external interconnect, the paddle, and the tie bar;
the integrated circuit die is on the paddle with an adhesive;
the stiffener structure is a conductive stiffener, having the opening, on the mounting structure with solder;
the stiffener structure along with the mounting structure is connected to a ground; and
the encapsulation is a top center gate encapsulation to cover the integrated circuit die and partially cover the stiffener structure with the encapsulation in the opening.

17. The system as claimed in claim 16 wherein the encapsulation to cover the integrated circuit die and partially cover the conductive stiffener through the opening includes the conductive stiffener partially exposed to ambient.

18. The system as claimed in claim 16 further comprising:
a ring, connected to the tie bar, as part of the mounting structure; and
wherein the conductive stiffener on the mounting structure includes:
the conductive stiffener soldered with the ring.

19. The system as claimed in claim 16 further comprising:
a segment, connected to the external interconnect, as part of the mounting structure; and
wherein the conductive stiffener on the mounting structure includes:
the conductive stiffener soldered with the segment.

20. The system as claimed in claim 16 wherein the conductive stiffener on the mounting structure includes the conductive stiffener soldered with the tie bar.

* * * * *